(12) United States Patent
Disney

(10) Patent No.: US 6,680,646 B2
(45) Date of Patent: *Jan. 20, 2004

(54) POWER INTEGRATED CIRCUIT WITH DISTRIBUTED GATE DRIVER

(75) Inventor: Donald Ray Disney, Cupertino, CA (US)

(73) Assignee: Power Integrations, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/410,725

(22) Filed: Apr. 9, 2003

(65) Prior Publication Data

US 2003/0206047 A1 Nov. 6, 2003

Related U.S. Application Data

(63) Continuation of application No. 10/127,989, filed on Apr. 22, 2002, now Pat. No. 6,583,663.

(51) Int. Cl.[7] .............................................. H01L 25/09
(52) U.S. Cl. ...................................... 327/566; 327/565
(58) Field of Search ................................. 327/565, 566, 327/564, 108–112

(56) References Cited

U.S. PATENT DOCUMENTS

| | | | | | |
|---|---|---|---|---|---|
| 4,949,139 | A | * | 8/1990 | Korsh et al. | 327/391 |
| 4,999,759 | A | * | 3/1991 | Cavagnolo et al. | 363/21.01 |
| 5,334,885 | A | * | 8/1994 | Morris | 326/83 |
| 5,610,503 | A | * | 3/1997 | Fogg et al. | 323/283 |
| 6,184,737 | B1 | * | 2/2001 | Taguchi | 327/319 |
| 6,225,664 | B1 | * | 5/2001 | Endo et al. | 257/347 |
| 6,313,671 | B1 | * | 11/2001 | Le et al. | 327/112 |
| 6,313,672 | B1 | * | 11/2001 | Ajit et al. | 327/112 |
| 6,362,608 | B1 | * | 3/2002 | Ashburn et al. | 323/272 |

* cited by examiner

*Primary Examiner*—Timothy P. Callahan
*Assistant Examiner*—Cassandra Cox
(74) *Attorney, Agent, or Firm*—Burgess & Bereznak, LLP

(57) ABSTRACT

A power integrated circuit includes a gate driver coupled to an output transistor having a plurality of segments. The gate driver also has a plurality of segments, each of the segments of the driver circuit being located adjacent a corresponding one of the segments of the output transistor. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

19 Claims, 3 Drawing Sheets

POWER INTEGRATED CIRCUIT WITH DISTRIBUTED GATE DRIVER

RELATED APPLICATIONS

This application is a continuation of application Ser. No. 10/127,989 filed Apr. 22, 2002, now U.S. Pat. No. 6,583,663 which is assigned to the assignee of the present application.

FIELD OF THE INVENTION

The present invention relates to power integrated circuits (ICs); more particularly, to an IC with a high voltage output device.

BACKGROUND OF THE INVENTION

A common type of integrated circuit device is a metal-oxide-semiconductor field effect transistor (MOSFET). A MOSFET is a field-effect device that includes a source region, a drain region, a channel region extending between the source and drain regions, and a gate provided over the channel region. The gate includes a conductive gate structure disposed over and insulated from the channel region by a thin oxide layer.

Large, lateral MOSFET devices are widely used in power integrated circuits that operate at high voltages. Power ICs typically contain one or more large high-voltage output transistors that control the current flow to one or more external loads. In certain applications the high-voltage output transistor operates at a high switching speed. For instance, in a switch-mode power supply integrated circuit one output transistor controls the current through the primary winding of a transformer, and thereby controls the power delivered by the power supply. An example of a power supply circuit in which a switching transistor is coupled to the primary winding of a transformer is disclosed in U.S. Pat. No. 4,999,759. A power IC with an integrated circuit driver is described in U.S. Pat. No. 6,225,664 B1.

In a power IC, the large output transistor is typically designed as an array of elongated segments comprising the source and drain regions of the MOSFET. To increase the current handling capability of the output transistor, more segments are simply added to the device. In certain designs, the source and drain regions of the output transistor are arranged in an interdigitated manner in which the segments may include one or more pairs of source/drain "fingers". By way of background, U.S. Pat. No. 5,258,636 describes a high-voltage transistor having interdigitated source drain regions.

Power ICs also generally include a control circuit that controls the output transistor. The control circuit generates a signal that is applied to the gate of the output transistor to turn it on and off. This signal is produced by a gate driver, which typically comprises a relatively large PMOS transistor for turning on, and a relatively large NMOS transistor for turning off the output transistor. The speed at which the output transistor is turned on and off is a factor in determining the switching power loss of the output device. This becomes an increasingly important power loss component of the power IC as the switching frequency is increased. The distributed gate capacitance of the output transistor and the effective resistance between this capacitance and the turn-on voltage (typically $V_{DD}$) and the turn-off voltage (typically $V_{SS}$) largely determine the switching speed of the power device.

In prior art devices, the gate driver is located in the control circuit section on the IC chip, and a long bus is used to connect the output of the gate driver to the gate electrodes of each segment of the output transistor. Such an arrangement is shown in FIG. 1.

FIG. 1 is a plan view of a typical prior art power IC 10 that includes a gate driver 12 physically located in the same section of the chip as control circuit 11. A bus 13 connects the output of gate driver 12 to the gate electrodes of output transistor 14. Although not depicted in detail in the example of FIG. 1, output transistor 14 has four segments, with each segment including multiple pairs of elongated source/drain fingers. Each segment of output transistor 14 has an associated drain pad 15 and source pad 16.

One of the shortcomings of the prior art power IC of FIG. 1 is that the gate driver is required to be large enough to provide fast switching of the largest output device connected to a given control circuit. This requirement means that the gate driver is generally oversized for the products that comprise a smaller output transistor connected to the same control circuit, and thus wastes silicon area. Another drawback is that the bus that connects the gate driver to each of the segments of the output transistor becomes longer, and therefore more resistive, for larger output transistors. Higher resistance at this node in the circuit has an adverse affect on switching power loss of the power IC.

BRIEF DESCRIPTION OF THE DRAWINGS

The present invention is illustrated by way of example, and not limitation, in the figures of the accompanying drawings, wherein.

DETAILED DESCRIPTION

A power IC with a distributed gate driver circuit is described. In the following description, numerous specific details are set forth, such as device types, dimensions, circuit configurations, etc., in order to provide a thorough understanding of the present invention. Practitioners having ordinary skill in the IC arts will understand that the invention may be practiced without many of these details. In other instances, well-known circuit elements, techniques, and processing steps have not been described in detail to avoid obscuring the invention.

The present invention is a power integrated circuit that is fabricated on a semiconductor substrate. The power IC comprises a high-voltage output transistor coupled with a gate driver on the same substrate. In one embodiment, the gate driver and the output transistor both have a plurality of segments. The gate driver is distributed in a manner such that each of the driver segments of the gate driver are physically located adjacent a corresponding one of the output segments of the output transistor. This arrangement minimizes the distance between the gate of each output transistor segment and the gate driver. As a consequence, the resistance between the gate driver and the gate of the output transistor is reduced and high speed switching performance is improved. Gate driver size can also be scaled to match output transistor size without wasted silicon area.

Figure 1:
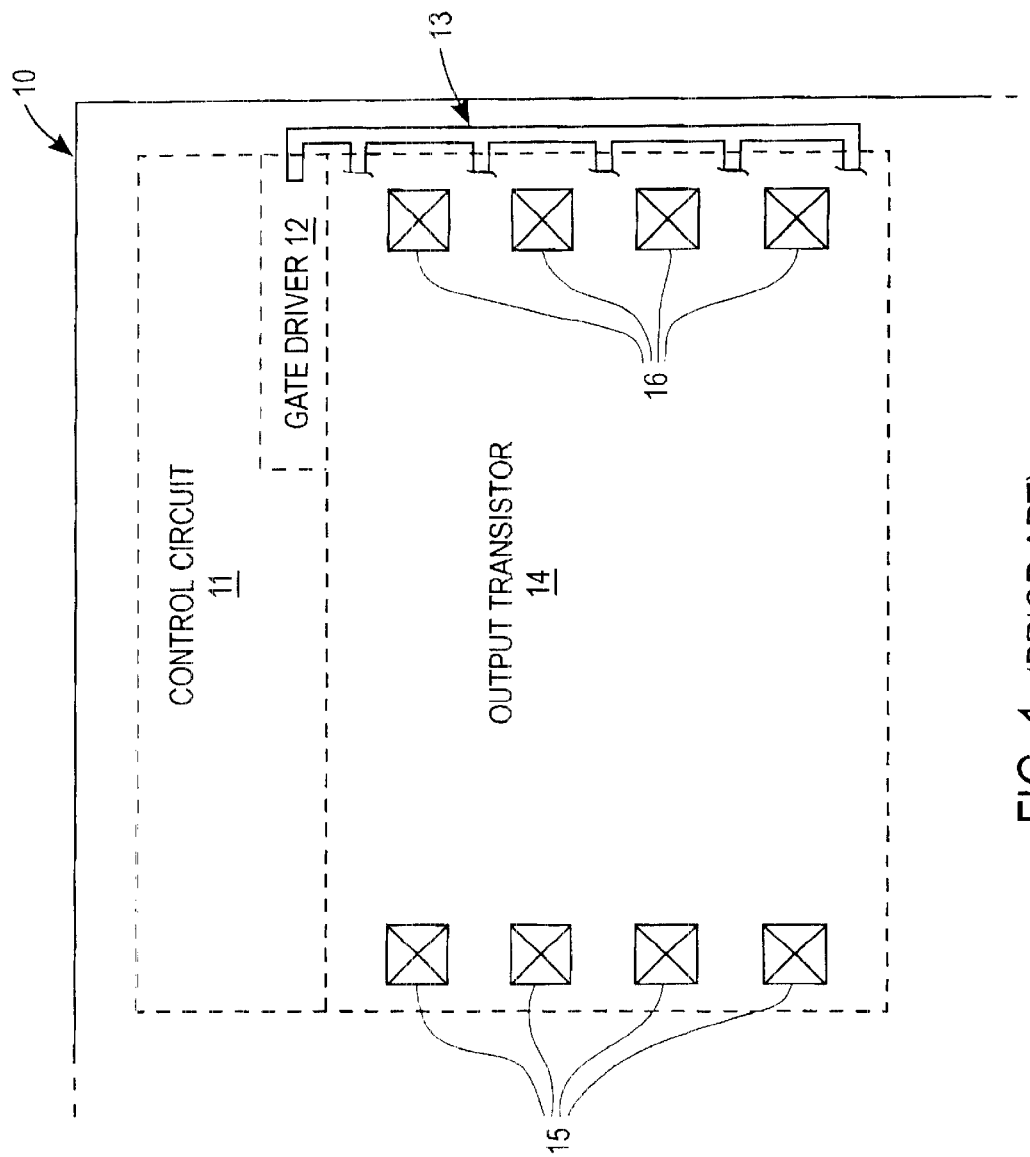
FIG. 1 is a plan view of a prior art power integrated circuit.
Figure 2:
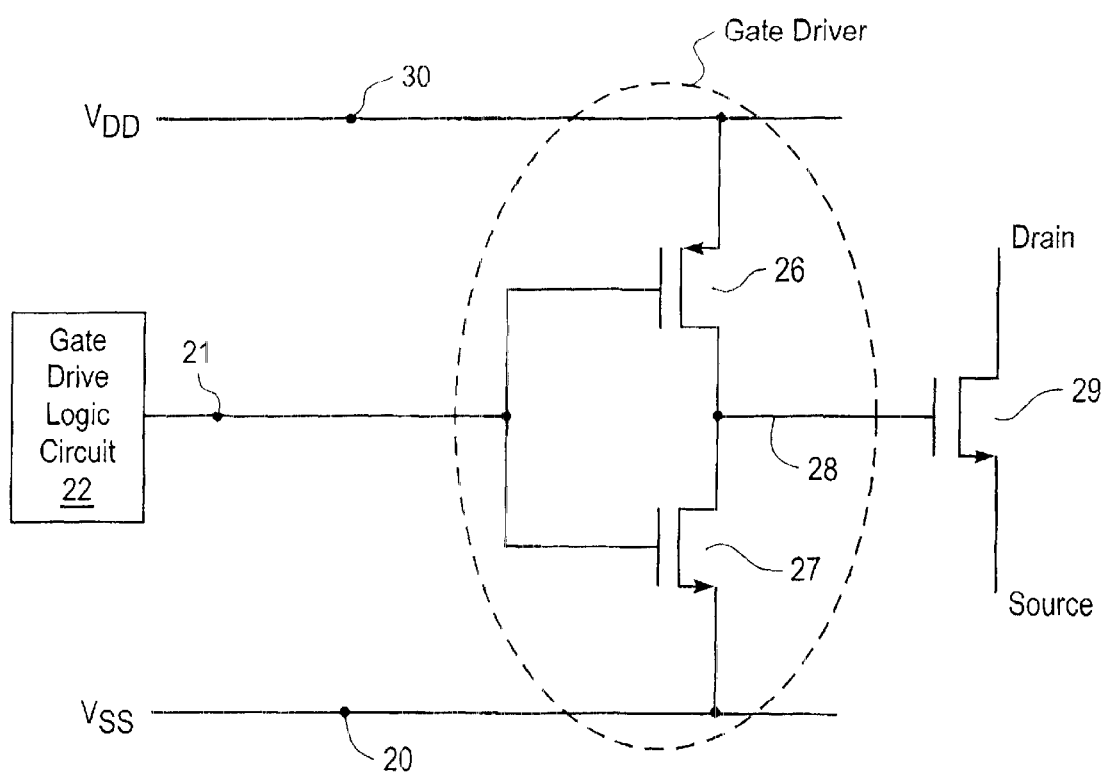
FIG. 2 is circuit schematic diagram of a power integrated circuit according to one embodiment of the present invention.

FIG. 2 is a circuit schematic diagram of the power IC according to one embodiment of the present invention, wherein gate driver logic circuit 22 applies a signal at node 21 that causes output transistor 29 to switch state. Circuit 22 comprises ordinary logic that produces a digital pulse signal (e.g., a pulse width modulation signal) that controls the switching operation of transistor 29. Node 21 is the input node of a gate driver comprising PMOS transistor 26 and NMOS transistor 27, which are shown coupled in series between $V_{DD}$ supply line 30 and $V_{SS}$ supply line 20. The gate driver is coupled at node 28 to the gate of output transistor 29.

To achieve low on-state resistance to drive output transistor 29 at high speeds, the PMOS and NMOS transistors 26 & 27 of the gate driver may have relatively large gate widths. As an example of the relative device sizes, output transistor 29 may typically have a gate width of 340,000 um, and NMOS transistor 27 of the gate driver may have a gate width of 13,000 um.

Figure 3:
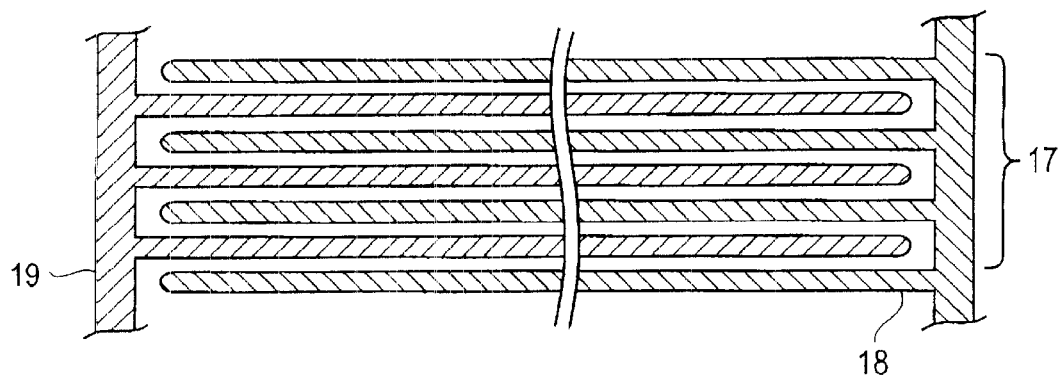
FIG. 3 is a top layout view of a portion of an output transistor utilized in one embodiment of the present invention.

Referring now to FIG. 3, there is shown a top layout view of a portion of output transistor utilized in one embodiment of the present invention. In this example, the drain 19 and source 18 electrode metalization patterns for a segment 17 of output transistor 29 are shown to illustrate the interdigitated pattern between the source/drain regions. It should be understood that in the context of the present application, a segment identifies a grouping of one or more fingers of an interdigitated transistor. In FIG. 3, for example, segment 17 comprises three pairs of source/drain fingers.

Figure 4:
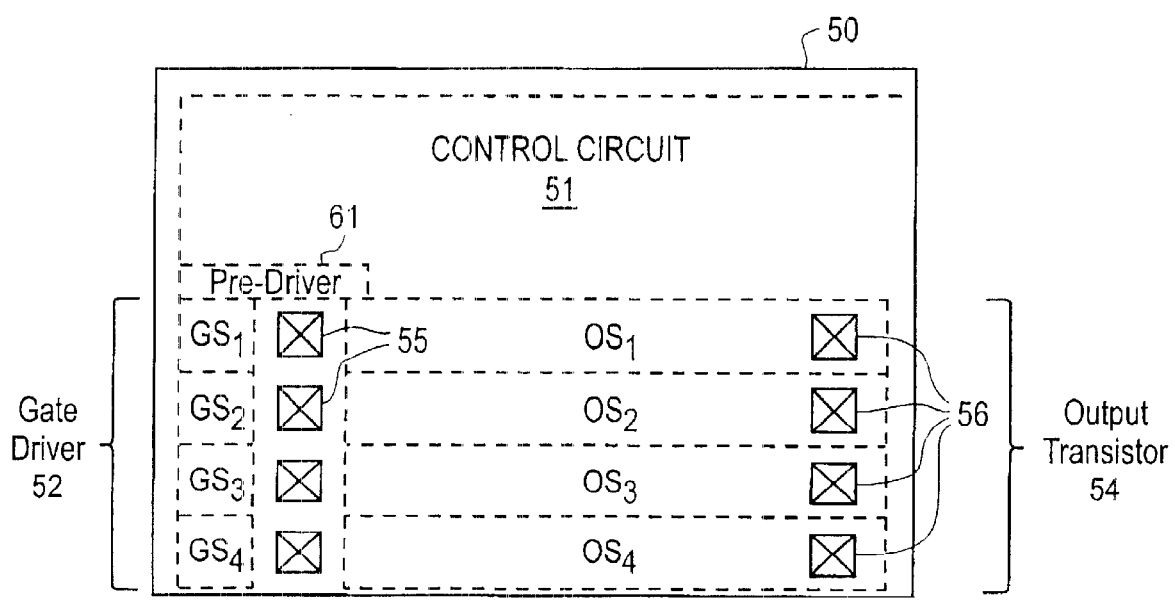
FIG. 4 is a plan view of a portion of a power integrated circuit according to one embodiment of the present invention.

FIG. 4 is a plan view of a power IC 50 according to one embodiment of the present invention. Power IC 50 includes a control circuit 51 and a large output transistor 54 that includes four segments, denoted as $OS_1$–$OS_4$ in FIG. 4. A source pad 55 and a drain pad 56 are shown arranged at opposite ends of each output transistor segment in this particular embodiment. Other embodiments may implement different arrangements for the source and drain pads. It is appreciated that other embodiments may include more or fewer segments. The number of source/drain fingers that comprise each of the segments may also vary for different embodiments. The gate driver 52 is also arranged into segments $GS_1$–$GS_4$, each of which comprises a number of source/drain fingers. Each of the gate driver segments is located adjacent a corresponding output segment of output transistor 54.

The gate driver segments $GS_1$–$GS_4$ are all driven in parallel by a signal generated by control circuit 51. Each gate driver segment contains a PMOS device to turn on the gate of output transistor 54, and an NMOS device to turn off the gate of transistor 54. The PMOS and NMOS devices are appropriately sized to provide the proper resistance, which largely determines the turn on and turn off switching speeds of the output device.

In the particular embodiment of FIG. 4, the NMOS device in each gate driver segment is located adjacent a source pad 55 of the corresponding output transistor segment. This arrangement results in minimal resistance between the gate and source of output transistor 54 when the NMOS driver device is turned on.

In an alternative embodiment, only one of the PMOS or NMOS driver devices is distributed in this manner, while the other driver device is located elsewhere, e.g., in the control circuit section of the IC. For instance, if the turn-off speed of output transistor 54 is of much higher importance than the turn-on speed, only the larger NMOS driver device may be distributed adjacent output transistor 54, with each of the NMOS segments being located adjacent a corresponding segment of transistor 54. In such a case, the smaller PMOS driver device may be located in the control circuit section of the chip.

On the other hand, if much more importance is placed on turn-on speed, the PMOS driver device may be distributed adjacent the output device and the NMOS driver device could be located in the control circuit section of the IC.

It should be understood that although the present invention has been described in conjunction with specific embodiments, numerous modifications and alterations are well within the scope of the present invention. Accordingly, the specification and drawings are to be regarded in an illustrative rather than a restrictive sense.

I claim:

1. A power integrated circuit comprising:
   an output transistor having a plurality of segments;
   a gate driver coupled to the output transistor, the gate driver having a plurality of segments distributed adjacent to the segments of the output transistor.

2. The power integrated circuit according to claim 1 wherein each of the segments of the output transistor comprises one or more source/drain fingers.

3. The power integrated circuit according to claim 1 wherein the gate driver comprises a PMOS device and an NMOS device.

4. The power Integrated circuit according to claim 3 wherein the PMOS and NMOS devices are configured as an inverter.

5. The power Integrated circuit according to claim 3 wherein the PMOS and NMOS devices are coupled in series between $V_{DD}$ and $V_{SS}$.

6. The power integrated circuit according to claim 3 wherein the segments of the gate driver comprise one or more source/drain fingers of the PMOS device.

7. The power Integrated circuit according to claim 3 wherein the segments of the gate driver comprise one or more source/drain fingers of the NMOS device.

8. The power integrated circuit according to claim 3 wherein the segments of the gate driver comprise one or more source/drain fingers of each of the PMOS and NMOS devices.

9. The power Integrated circuit according to claim 1 further comprising a logic circuit coupled to the gate driver, the logic circuit generating a switching signal.

10. The power integrated circuit according to claim 1 wherein each segment of the gate driver is located adjacent a source pad of the god output transistor.

11. A power integrated circuit comprising:
    an output transistor having a plurality of segments;
    a gate driver coupled to the output transistor, the gate driver having two or more segments, each of the segments of the gate driver being located adjacent one of the segments of the output transistor.

12. The power integrated circuit according to claim 11 wherein each of the segments of the output transistor comprises one or more source/drain fingers.

13. The power integrated circuit according to claim 11 wherein the gate driver comprises a PMOS device and an NMOS device.

14. The power integrated circuit according to claim 13 wherein the PMOS and NMOS devices are configured as an inverter.

15. The power integrated circuit according to claim 13 wherein the PMOS and NMOS devices are coupled in series between $V_{DD}$ and $V_{SS}$.

16. The power integrated circuit according to claim 13 wherein the segments of the gate driver comprise one or more source/drain fingers of the PMOS device.

17. The power integrated circuit according to claim 13 wherein the segments of the gate driver comprise one or more source/drain fingers of the NMOS device.

18. The power integrated circuit according to claim 13 wherein the segments of the gate driver comprise one or more source/drain fingers of each of the PMOS and NMOS devices.

19. The power integrated circuit according to claim 11 wherein each segment of the gate driver is located adjacent a source pad of the output transistor.

* * * * *